United States Patent
Takada et al.

(10) Patent No.: US 6,246,271 B1
(45) Date of Patent: Jun. 12, 2001

(54) FREQUENCY MULTIPLIER CAPABLE OF GENERATING A MULTIPLE OUTPUT WITHOUT FEEDBACK CONTROL

(75) Inventors: Shuichi Takada, Kawasaki; Akihiko Yoshizawa, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/521,208

(22) Filed: Mar. 8, 2000

(30) Foreign Application Priority Data

Mar. 11, 1999 (JP) ................................. 11-064587

(51) Int. Cl.[7] ............................................ H03B 19/00
(52) U.S. Cl. .......................... 327/116; 327/119; 327/122
(58) Field of Search .................................. 327/116, 119, 327/120, 121, 122

(56) References Cited

U.S. PATENT DOCUMENTS

| | | | |
|---|---|---|---|
| 5,297,179 | * 3/1994 | Tatsumi | 377/47 |
| 5,530,387 | * 6/1996 | Kim | 327/119 |
| 5,587,673 | 12/1996 | MacDonald | 326/93 |
| 6,091,271 | * 7/2000 | Pant et al. | 327/122 |

* cited by examiner

Primary Examiner—Toan Tran
Assistant Examiner—Cassandra Cox
(74) Attorney, Agent, or Firm—Oblon, Spivak, McClelland, Maier & Neustadt, P.C.

(57) ABSTRACT

In a frequency multiplier which generates a multiple output of a reference signal, a reference signal and its inverted signal are propagated through a pair of delay circuits each including a given number of delay cells connected in cascade. The delay cells delay a signal by time t when a control signal is at a high level and delay a signal by time 2t when a control signal is at a low level. The outputs of the delay circuits are added together by an adder circuit to generate a multiple output without using a low-pass filter but by non-feedback control.

20 Claims, 7 Drawing Sheets

FREQUENCY MULTIPLIER CAPABLE OF GENERATING A MULTIPLE OUTPUT WITHOUT FEEDBACK CONTROL

CROSS-REFERENCE TO RELATED APPLICATION

This application is based upon and claims the benefit of priority from the prior Japanese Patent Application No. 11-064587, filed Mar. 11, 1999, the entire contents of which are incorporated herein by reference.

BACKGROUND OF THE INVENTION

The present invention relates to a frequency multiplier capable of generating a multiple output without feedback control (by non-feedback control). More specifically, the present invention relates to a frequency multiplier for use in a clock generator of a microcomputer, a DSP (digital signal processor) and the like.

Conventionally an N multiplier using a PLL (phase locked loop) circuit has been known well as a frequency multiplier.

FIG. 1 shows an example of an arrangement of a generally-used N multiplier employing a PLL circuit. The N multiplier includes a voltage control oscillator 101, an N frequency divider 102, a phase comparator 103 and a low-pass filter 104. The N multiplier performs feedback control to cancel a phase difference between a reference signal Fin and an output of the N frequency divider 102. Finally, the voltage control oscillator 101 generates an output signal Fout whose frequency is N times as high as that of the reference signal Fin. In other words, the oscillation frequency of the voltage control oscillator 101 is varied by a control voltage output from the low-pass filter 104. The N frequency divider 102 supplies the phase comparator 103 with a signal obtained by N-dividing an output of the voltage control oscillator 101. The phase comparator 103 supplies the low-pass filter 104 with an error signal corresponding to a phase difference between the reference signal Fin and the rising (or falling) edge of a signal output from the N frequency divider 102. The low-pass filter 104 extracts only the DC components from the error signal output from the phase comparator 103 and generates a control voltage for controlling the oscillation frequency of the voltage control oscillator 101.

In the above-described conventional N multiplier using a PLL circuit, however, it was necessary to optimize and adjust the low-pass filter 104 such that a control loop could be constantly stabilized in accordance with both a frequency of the reference signal Fin and an oscillation gain of the voltage control oscillator 101. For this reason, the low-pass filter 104 had to be optimized every time the frequency of the reference signal Fin was varied or the oscillation gain of the voltage control oscillator 101 was changed with manufacturing variations.

If, moreover, the components of capacitors and resistors used in the low-pass filter 104 are built in an LSI (large scale integrated circuit), a very large area is needed and, in this case, the manufacturing variations of the components have to be taken into consideration. On the other hand, if the components of capacitors and resistors are mounted externally, a special-purpose terminal is required. Thus, the low-pass filter 104 is an obstacle to miniaturization of the N multiplier.

BRIEF SUMMARY OF THE INVENTION

An object of the present invention is to provide a frequency multiplier which is capable of generating an unregulated, stable multiple output without feedback control and which can be decreased in size.

In order to attain the above object, a frequency multiplier according to a first aspect of the present invention comprises a first delay circuit including a plurality of delay cells connected in cascade, each of the delay cells varying a delay amount between input and output signals in response to a first control signal, and a first one of the delay cells being supplied with a reference signal; a second delay circuit including a plurality of delay cells connected in cascade, each of the delay cells varying a delay amount between input and output signals in response to a second control signal, and a first one of the delay cells being supplied with an inverted signal of the reference signal; and an adder circuit for adding an output signal of the first delay circuit and an output signal of the second delay circuit together to generate a multiple signal of the reference signal.

A frequency multiplier according to a second aspect of the present invention comprises a first delay circuit having a plurality of delay circuit sections connected in cascade, a first one of the delay circuit sections being supplied with a reference signal, each of the delay circuit sections including; a delay cell in which a delay amount between input and output signals is varied substantially at a fixed rate in response to a first switching signal; a first level detection circuit having a first input terminal supplied with a first control signal and a second input terminal supplied with an output signal of the delay cell, for detecting a level of the output signal of the delay cell at a timing corresponding to one of rising and falling edges of the first control signal; and a switching circuit for generating the first switching signal based on a detection result of the first level detection circuit and the first control signal, and supplying the first switching signal to the delay cell; a second delay circuit having a plurality of delay circuit sections connected in cascade, a first one of the delay circuit sections being supplied with an inverted signal of the reference signal, each of the delay circuit sections including; a delay cell in which a delay amount between input and output signals is varied substantially at a fixed rate in response to a second switching signal; a second level detection circuit having a first input terminal supplied with a second control signal and a second input terminal supplied with an output signal of the delay cell, for detecting a level of the output signal of the delay cell at a timing corresponding to one of rising and falling edges of the second control signal; and a switching circuit for generating the second switching signal based on a detection result of the second level detection circuit and the second control signal, and supplying the second switching signal to the delay cell; and an adder circuit for adding an output signal of the first delay circuit and an output signal of the second delay circuit together to generate a multiple signal of the reference signal.

According to the frequency multiplier of the present invention, a multiple output can be generated only by propagating a reference signal through a delay circuit, without any parts such as capacitors and resistors for low-pass filters or without feedback control.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.
(First Embodiment)

Figure 1:
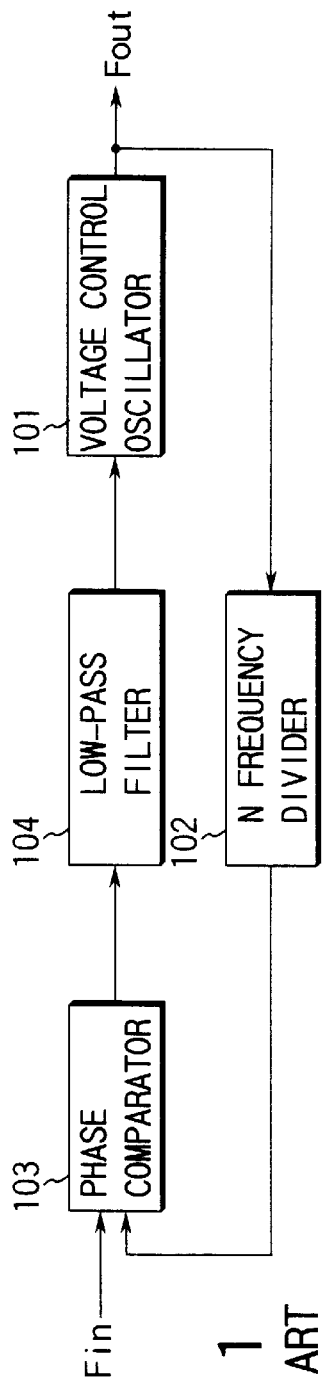
FIG. 1 is a block diagram schematically showing an arrangement of a prior art N multiplier using a PLL circuit.
Figure 2:
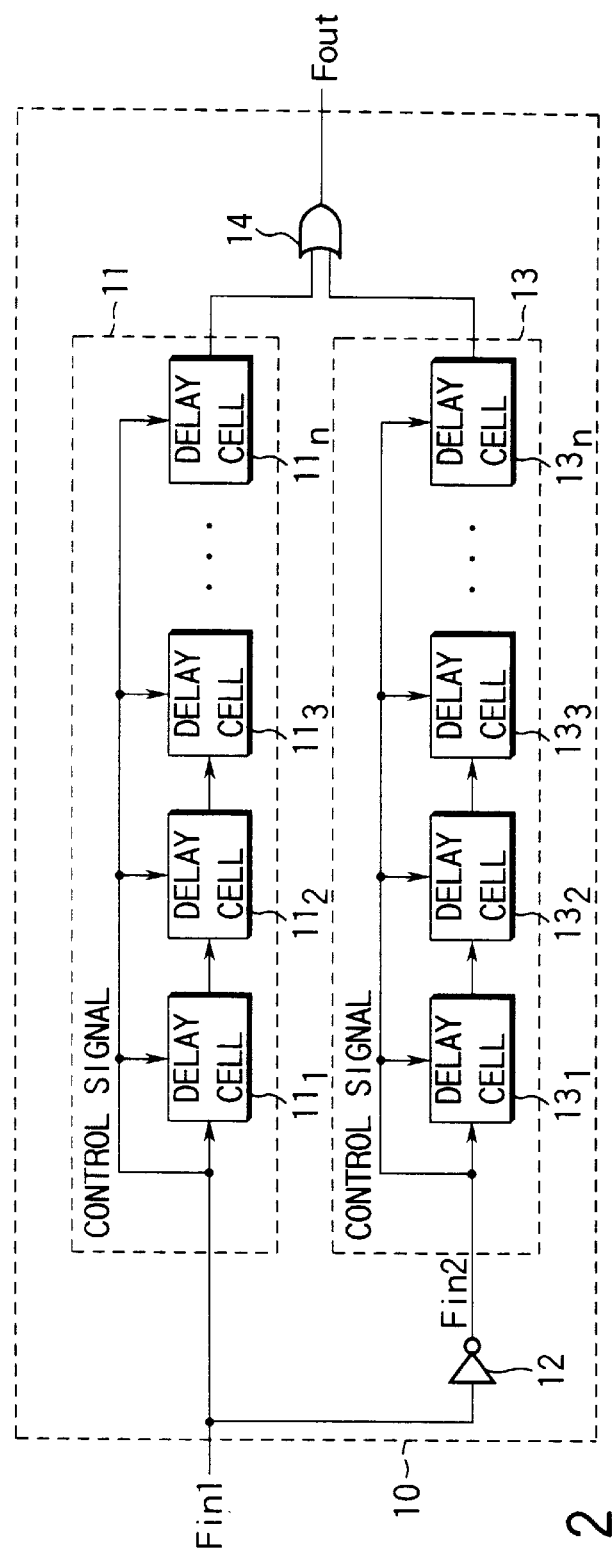
FIG. 2 is a block diagram schematically showing an arrangement of a frequency multiplier according to a first embodiment of the present invention.

FIG. 2 schematically shows an arrangement of a frequency multiplier 10 according to a first embodiment of the present invention. The frequency multiplier 10 includes a delay circuit (first delay circuit) 11 supplied with a reference signal Fin1 the duty of which is 50%, a delay circuit (second delay circuit) 13 supplied with an inverted signal (reference signal) Fin2 of the reference signal Fin1 through an inverter circuit 12, and an adder circuit 14 for adding output signals of the delay circuits 11 and 13 to generate a multiple signal Fout of the reference signal Fin1.

The delay circuit 11 includes a plurality of delay cells $11_1$ to $11_n$ which are connected in cascade and capable of switching a delay time (a delay amount) between input and output signals at a fixed rate according to the condition (high or low level) of the control signal (first control signal). The delay cell $11_1$ in the first stage is supplied with the reference signal Fin1 as an input signal. The output signal of the delay cell $11_n$ in the final stage is supplied to the adder circuit 14 as an output signal of the delay circuit 11. In this case, the reference signal Fin1 is used as a control signal for the delay cells $11_1$ to $11_n$.

The delay circuit 13 includes a plurality of delay cells $13_1$ to $13_n$ which are connected in cascade and capable of switching a delay time between input and output signals at a fixed rate according to the condition of the control signal (second control signal). The delay cell $13_1$ in the first stage is supplied with the inverted signal Fin2 as an input signal. The output signal of the delay cell $13_n$ in the final stage is supplied to the adder circuit 14 as an output signal of the delay circuit 13. In this case, the inverted signal Fin2 is used as a control signal for the delay cells $13_1$ to $13_n$.

Figure 3:
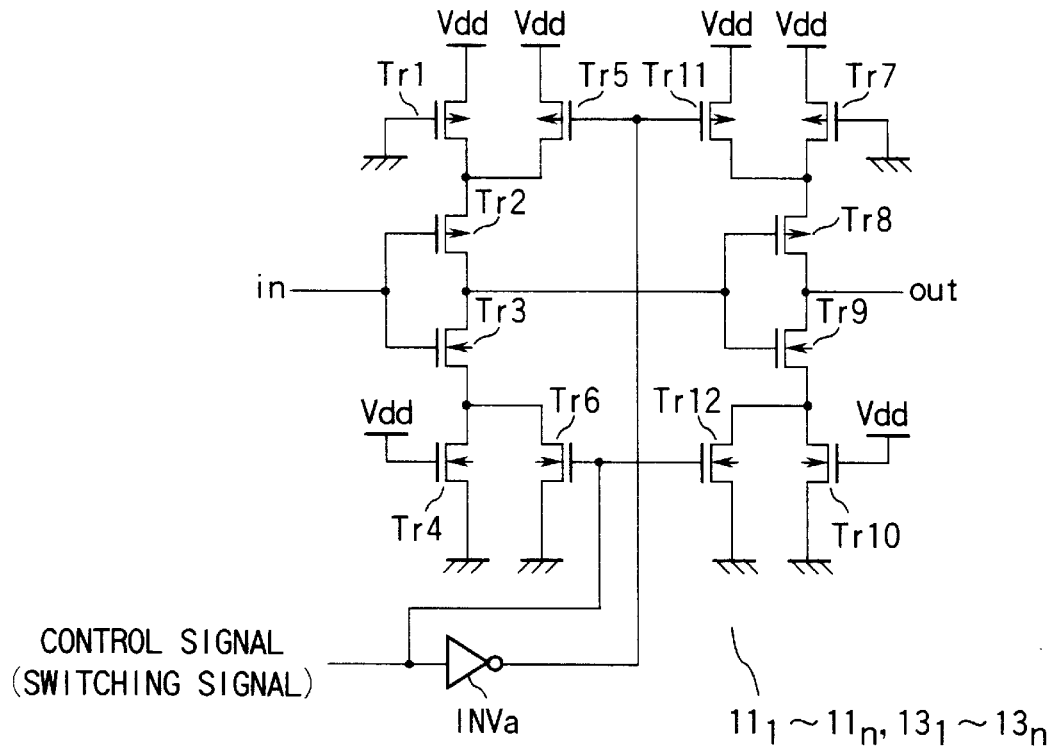
FIG. 3 is a circuit diagram schematically showing an example of a delay cell of the frequency multiplier shown in FIG. 2.
Figure 4A:
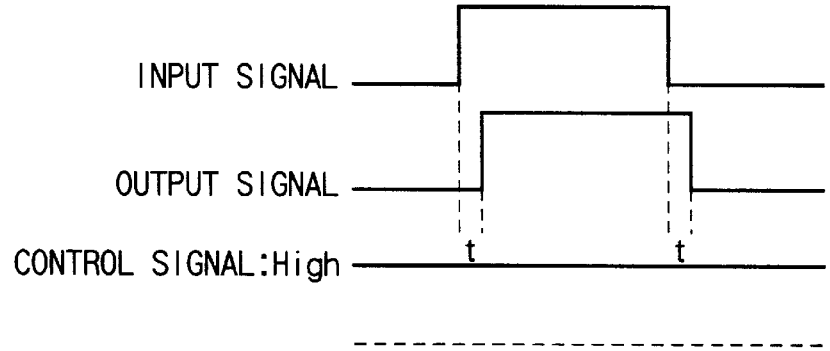
FIGS. 4A and 4B are charts of waveforms for explaining an overview of an operation of the delay cell shown in FIG. 3.
Figure 4B:
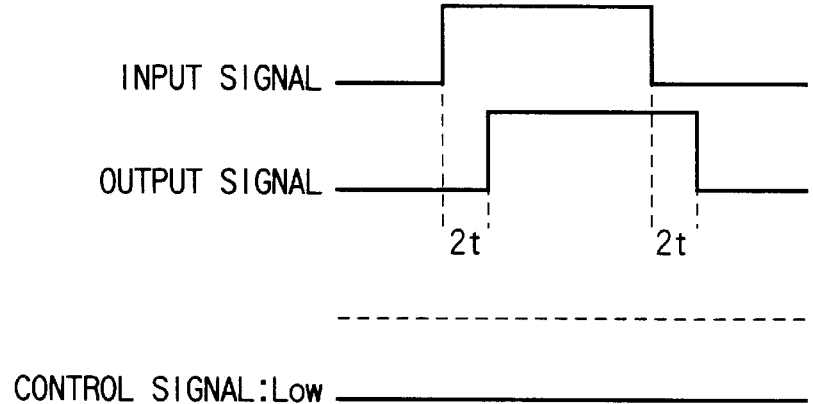

Referring to FIGS. 3, 4A and 4B, an overview of the delay cells $11_1$ to $11_n$ and $13_1$ to $13_n$ will now be described.

FIG. 3 shows an example of a circuit arrangement of the delay cells $11_1$ to $11_n$ and $13_1$ to $13_n$. Each of these delay cells is so constituted that it can delay an output signal by time t (propagation velocity 2v) with respect to an input signal, as shown in FIG. 4A, when a control signal is at a high level (or a low level) and it can delay an output signal by time 2t (propagation velocity v) with respect to an input signal, as shown in FIG. 4B, when a control signal is at a low level (or a high level).

As illustrated in FIG. 3, each of the delay cells $11_1$ to $11_n$ and $13_1$ to $13_n$ includes a first inverter circuit having pMOS transistors Tr1 and Tr2 and nMOS transistors Tr3 and Tr4 connected in cascade between a power supply Vdd and a ground potential (GND) and a second inverter circuit having pMOS transistors Tr7 and Tr8 and nMOS transistors Tr9 and Tr10 connected in cascade. In the first inverter circuit, the gate of the transistor Tr1 is connected to the ground potential and the source thereof is connected to the power supply Vdd. The drain of a pMOS transistor Tr5 whose source is connected to the power supply Vdd, is connected to a node between the drain of the transistor Tr1 and the source of the transistor Tr2. A control signal is supplied to the gate of the transistor Tr5 through an inverter circuit INVa. The drains of the transistors Tr2 and Tr3 are connected to each other at a common node, and the gates of the transistors Tr8 and Tr9 in the second inverter circuit are connected to the common node. Furthermore, the gates of the transistors Tr2 and Tr3 are connected to an input terminal in supplied with an input signal. The source of the transistor Tr4 is connected to the ground potential, and the gate thereof is connected to the power supply Vdd. The drain of an nMOS transistor Tr6 whose source is connected to the ground potential, is connected to a node between the drain of the transistor Tr4 and the source of the transistor Tr3. The gate of the transistor Tr6 is supplied with a control signal.

In the second inverter circuit, the gate of the transistor Tr7 is connected to the ground potential, and the source thereof is connected to the power supply Vdd. The drain of a pMOS transistor Tr11 whose source is connected to the power supply Vdd, is connected to a node between the drain of the transistor Tr7 and the source of the transistor Tr8. A control signal is supplied to the gate of the transistor Tr11 through an inverter circuit INVa. The drains of the transistors Tr8 and Tr9 are connected to each other at a common node, and the common node is connected to an output terminal out for outputting an output signal. The source of the transistor Tr10 is connected to the ground potential, and the gate thereof is connected to the power supply Vdd. The drain of an nMOS transistor Tr12 whose source is connected to the ground potential, is connected to a node between the drain of the transistor Tr10 and the source of the transistor Tr9. The gate of the transistor Tr12 is supplied with a control signal.

In the above circuit arrangement, the delay time of each of the first and second inverter circuits in each of the delay cells $11_1$ to $11_n$ and $13_1$ to $13_n$ depends upon the size and driving force of the transistors Tr1 to Tr4 and Tr7 to Tr10. If, therefore, the transistors Tr5, Tr6, Tr11 and Tr12 are turned on or off in accordance with the state (high level or low level) of the control signal and the driving force of the first and second inverter circuits is changed when the control signal is at a high level and a low level, the delay time of each of the delay cells $11_1$ to $11_n$ and $13_1$ to $13_n$ can be changed at a fixed rate. In this case, the rate of delay time can be determined arbitrarily by adjusting a size ratio of the transistors Tr1 to Tr12.

The number of delay cells $11_1$ to $11_n$ in the delay circuit 11 and the number of delay cells $13_1$ to $13_n$ in the delay circuit 13 each corresponds to the number of stages in which an output signal having a pulse width (duty), which is half the half cycle time of the reference signals Fin1 and Fin2, is generated as an output of each of the delay circuits 11 and 13. For example, when the half cycle time of the reference signals Fin1 and Fin2 is T, delay time T0 between input and output signals of the delay circuits 11 and 13 is expressed as follows: T<T0<1.5T.

If a delay time of the delay cells $11_1$ to $11_n$ and $13_1$ to $13_n$ is selected in accordance with the state of the control signal, the pulse width of each of the reference signals Fin1 and Fin2 supplied to the delay circuits 11 and 13 varies gradually between T (half cycle time of reference signal Fin1) to T/2 as they propagate through the delay circuits 11 and 13. The signals propagating through the delay circuits 11 and 13 gradually decrease in pulse width (toward T/2) until the level of an instantaneous signal corresponding to the falling edge of the control signal becomes low. The pulse width (T/2) is maintained from when the level of an instantaneous signal corresponding to the falling edge of the control signal becomes low until that of an instantaneous signal corresponding to the rising edge of the control signal becomes high. After the instantaneous signal corresponding to the rising edge of the control signal becomes high, the pulse width is increased gradually (toward T).

In the above case, the reference signals Fin1 and Fin2 supplied to the delay circuits 11 and 13 are shifted in cycle from each other by half cycle time T. The number of delay cells $11_1$ to $11_n$ and $13_1$ to $13_n$ is therefore set in such a manner that a signal having a pulse width T/2 can be issued as an output of each of the delay circuits 11 and 13 from when an instantaneous signal corresponding to the falling edge of the control signal becomes low in level until an instantaneous signal corresponding to the rising edge thereof becomes high in level. Thus, as shown in FIG. 5, a 2-multiple signal of the reference signal Fin1 can be obtained from the adder circuit 14 as an output signal Fout.

Figure 5:
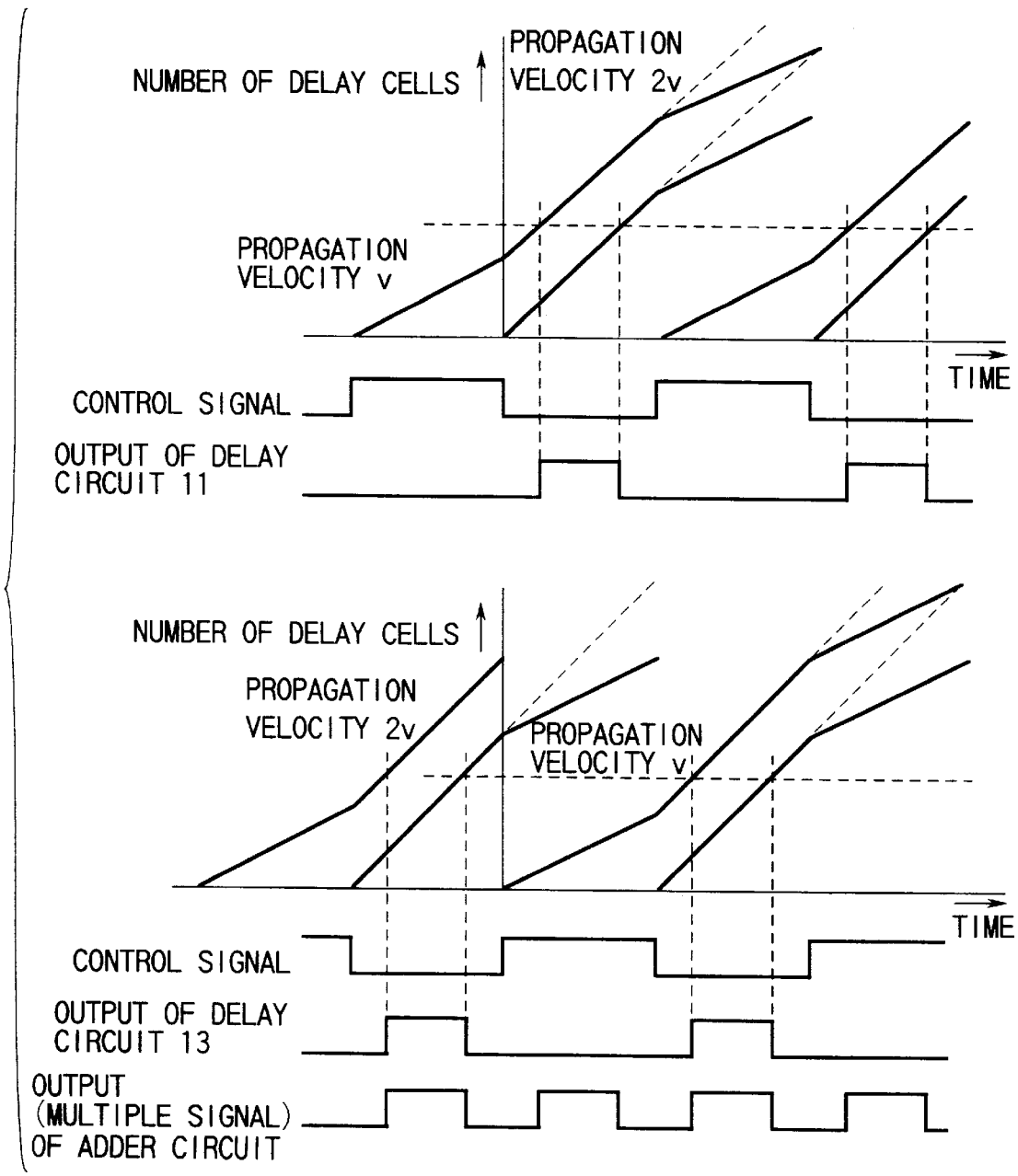
FIG. 5 is a chart of waveforms for explaining the number of delay cells in the frequency multiplier shown in FIG. 2.

In FIG. 5, the propagation velocity (delay amount) of the delay cells $11_1$ to $11_n$ and $13_1$ to $13_n$ in the delay circuits 11 and 13 is v when a control signal is at a high level, and it is 2v when the control signal is at a low level.

Figure 6:
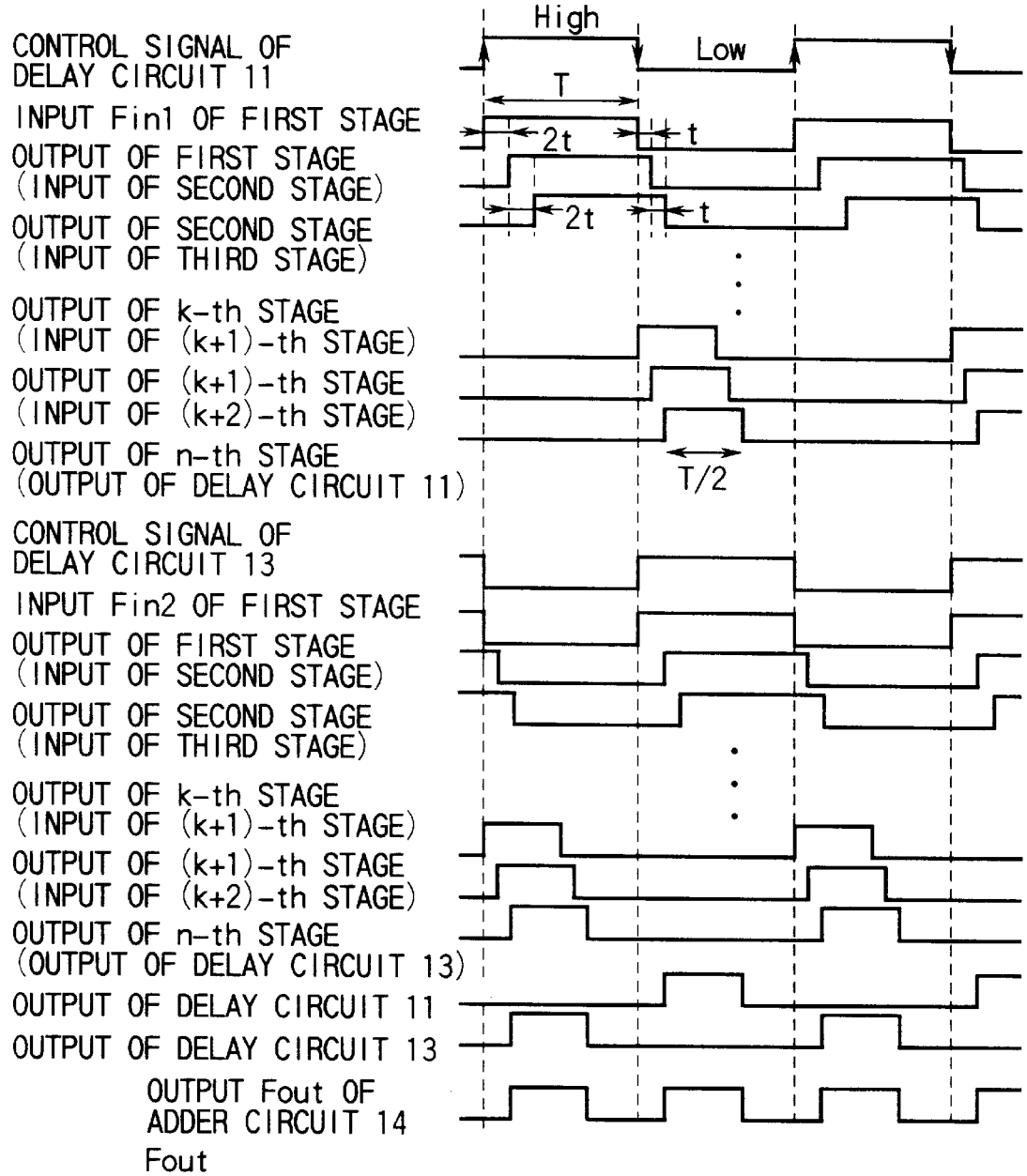
FIG. 6 is a chart of waveforms for explaining an overview of an operation of the frequency multiplier shown in FIG. 2.

Referring to FIG. 6, an operation (states of signals propagating through the delay circuits 11 and 13) of the frequency multiplier 10 having the above arrangement will now be described. Here the delay time of the delay cells $11_1$ to $11_n$ and $13_1$ to $13_n$ is 2t when a control signal is at a high level, and it is t when the control signal is at a low level.

An input signal (reference signal Fin1) supplied to a first (first-stage) delay cell $11_1$ in the delay circuit 11 is delayed 2t when the control signal is at a high level and delayed t when it is at a low level. The input signals are delayed in sequence by the second delay cell $11_2$ and its subsequent delay cells every time they are propagated. Finally, the pulse width of a signal output from the final (n-stage) delay cell $11_n$ after the k-stage delay cell, which is determined by the half cycle time T of the reference signal Fin1 and the delay time of each of the delay cells, is ½ of the half cycle time T of the reference signal Fin1. On the other hand, the cycle of an input signal (reference signal Fin2) supplied to the first-stage delay cell $13_1$ in the delay circuit 13 is shifted by the half cycle time from that of the reference signal Fin1. Thus, the cycle of the signal output from the final-stage delay cell $13_n$ is shifted by the half cycle time from that of the signal output from the final-stage delay cell $11_n$ in the delay circuit 11 and its pulse width is ½ of the half cycle time T of the reference signal Fin2. The output signal of the delay circuit 11 and that of the delay circuit 13 are added together by the adder circuit 14 to generate a multiple signal (Fout) whose frequency is twice as high as that of the reference signal Fin1 and whose duty is 50%.

The above frequency multiplier allows a frequency to be multiplied without feedback control or by non-feedback control. Moreover, it does not require any capacitors or resistors to be used in a low-pass filter. Thus, any adjustment for optimizing a low-pass filter is not needed and the frequency multiplier can easily be miniaturized.

As described above, a multiple signal can be generated only by propagating the reference signals through the delay circuits. In other words, the frequency multiplier is constituted of two pairs of delay circuits including a plurality of delay cells connected in cascade and capable of switching delay times to each other and an adder circuit for adding outputs of the delay circuits. Consequently, the frequency multiplier can generate a multiple signal without any parts such as capacitors and resistors for low-pass filters or without feedback control, with the result that the multiplier can easily be miniaturized.

(Second Embodiment)

In the first embodiment described above, the delay circuits 11 and 13 are so constituted that the number of delay cells $11_1$ to $11_n$ and $13_1$ to $13_n$ are determined to satisfy T<T0<1.5T when the half cycle time of the reference signal Fin1 is T and the delay time between input and output signals of the delay circuits 11 and 13 is T0. The present invention is not limited to this. For example, the delay circuits 11 and 13 can be constituted without restrictions on the number of delay cells $11_1$ to $11_n$ and $13_1$ to $13_n$.

Figure 7:
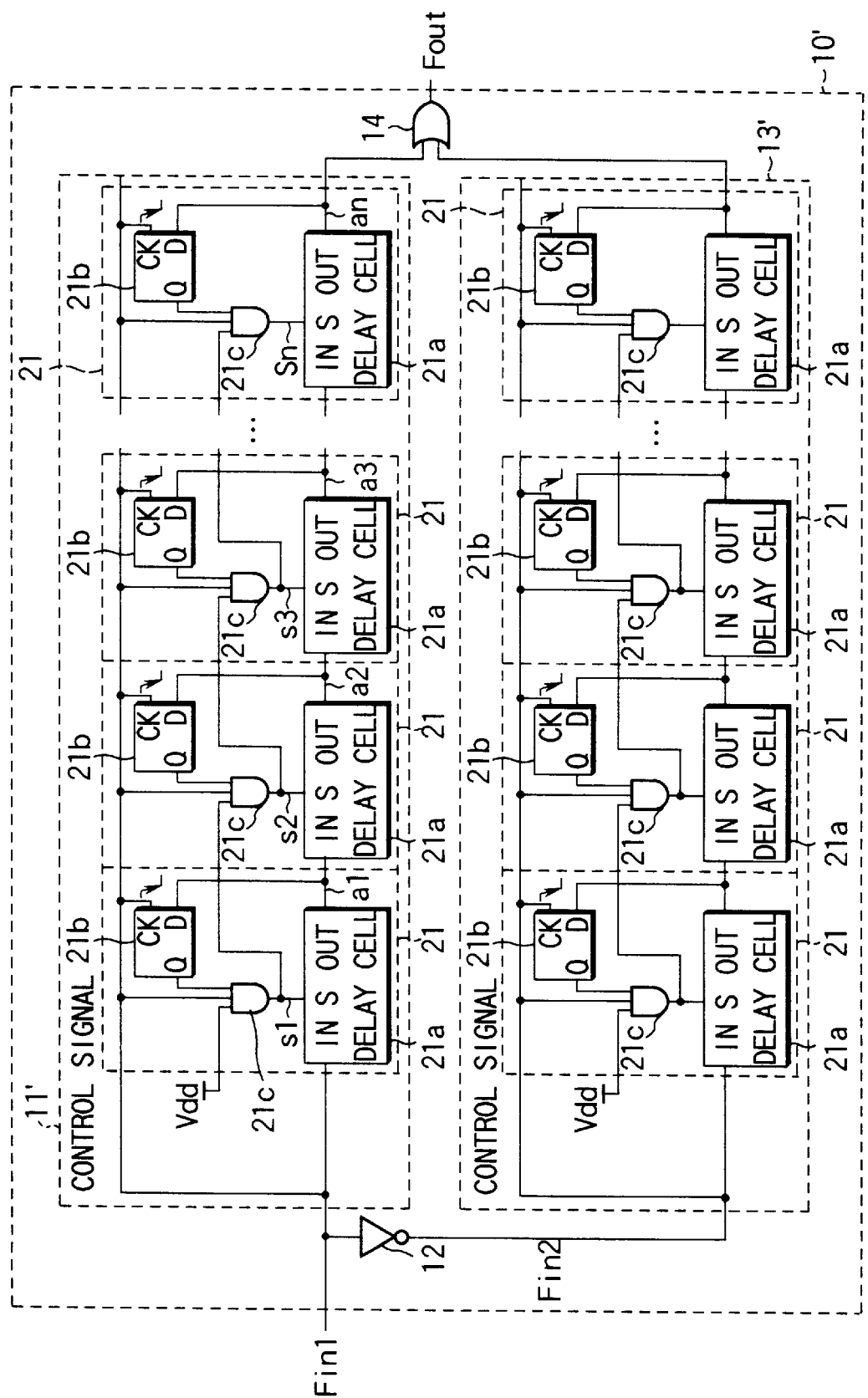
FIG. 7 is a block diagram schematically showing an arrangement of a frequency multiplier according to a second embodiment of the present invention.

FIG. 7 schematically shows an arrangement of a frequency multiplier 10', according to a second embodiment of the present invention. The frequency multiplier 10' of the second embodiment is constituted to remove restrictions on the number of delay cells by inhibiting switching of delay time by delay cells using the fact that an output signal of a delay cell has a half of the pulse width of the reference signals Fin1 and Fin2 when the output signal is at a low level at the instant corresponding to the falling edge of a control signal, as shown in FIG. 6.

The frequency multiplier 1' includes a delay circuit (first delay circuit) 11' supplied with a reference signal Fin1 whose duty is 50% and a delay circuit (second delay circuit) 13' supplied with an inverted signal (reference signal) Fin2 of the reference signal Fin1. Each of the delay circuits 11' and 13' is constituted of a plurality of delay cell blocks (delay circuit sections) 21 connected in cascade.

Each of the delay cell blocks 21 includes a delay cell 21a in which a delay time between input and output signals is varied at a fixed rate in response to a switching signal, a flip-flop circuit (F/F circuit) 21b of an edge detection type serving as a state detection circuit, and an AND circuit 21c used as a switching circuit. The delay cell 21a has a terminal S supplied with the switching signal, a terminal IN supplied with the input signal, and a terminal OUT from which the output signal is output. AS the delay cells 21a, the delay cells $11_1$ to $11_n$ and $13_1$ to $13_n$, which are used in the delay circuits 11 and 13 of the frequency multiplier 10 of the first embodiment as shown in FIG. 3, can be utilized as they are. However, the switching signal is used in place of the control signal to switch a delay time. The F/F circuit 21b includes a first input terminal CK supplied with a control signal (first control signal Fin1 or second control signal Fin2) and a second input terminal D supplied with an output signal from the delay cell 21a of the same block 21. The F/F circuit 21b also includes an output terminal Q for supplying the AND circuit 21c with a detection signal (of, e.g., low level) indicating that an output signal of the delay cell 21a is at a low level at the instant corresponding to the falling edge of the control signal. The AND circuit 21c generates an output signal for indicating switching of delay time (fixing of delay time) to both the terminal S of the delay cell 21a in the same block 21 and the AND circuit 21c in the next-stage cell block 21, in response to the above control signal, the detection signal of the F/F circuit 21b, and the output of the AND circuit 21c in the delay cell block 21 in the preceding stage.

The AND circuit 21c in the first-stage delay cell block 21 in each of the delay circuits 11', and 13' is supplied with a power supply voltage Vdd in place of a switching signal from the AND circuit 21c in the delay cell block 21 in the preceding stage.

Figure 8A:
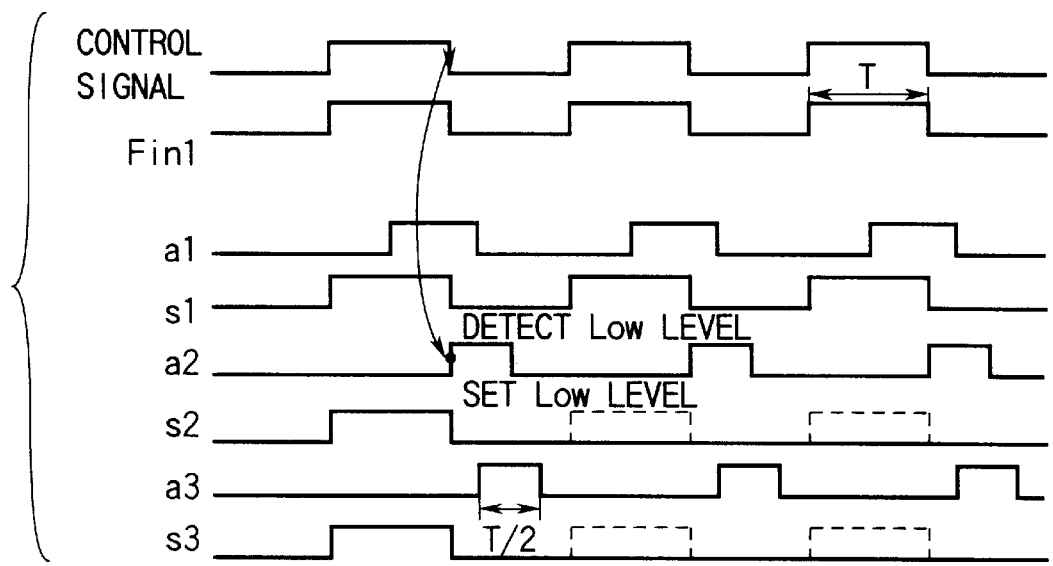
FIGS. 8A and 8B are charts of waveforms for explaining an overview of an operation of the frequency multiplier shown in FIG. 7.
Figure 8B:
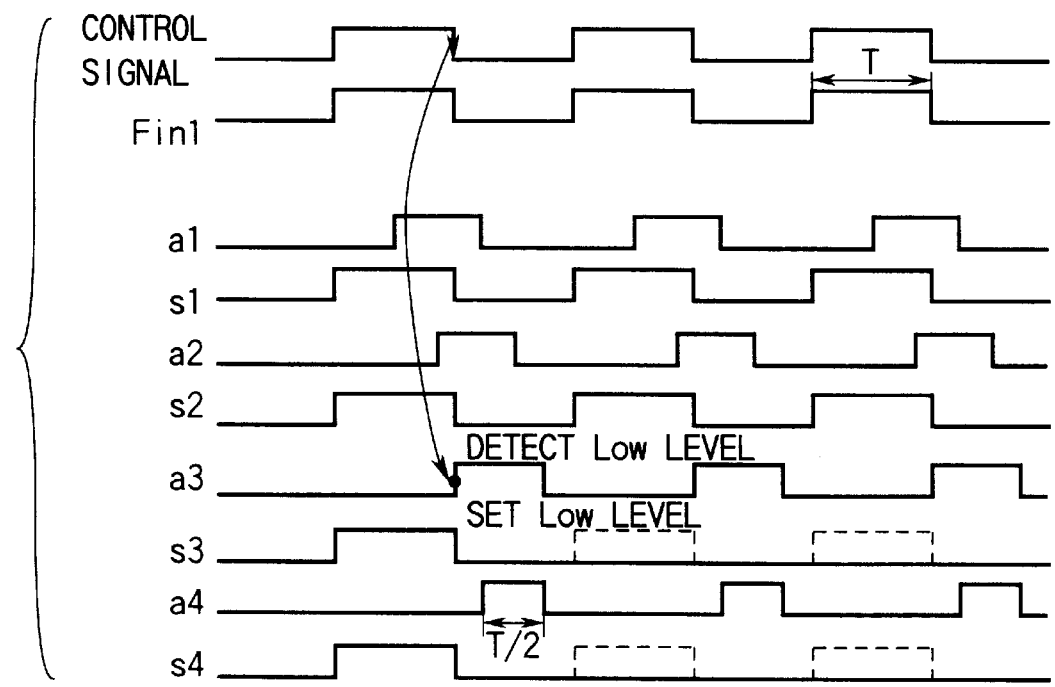

An operation of the frequency multiplier 10' having the above arrangement will now be described with reference to FIGS. 8A and 8B. In FIG. 8A, an output signal of a delay cell 21a in a first-stage delay cell block 21 is a1, a switching signal supplied to the delay cell 21a is s1, an output signal of a delay cell 21a in a second-stage delay cell block 21 is a2, a switching signal supplied to the delay cell 21a is s2, an output signal of a delay cell 21a in a third-stage delay cell block 21 is a3, a switching signal supplied to the delay cell 21a is s3, and similarly an output signal of a delay cell 21a in a final-stage delay cell block 21 is an, and a switching signal supplied to the delay cell 21a is sn, and the second-stage delay cell block 21 detects an inflection point at which an output signal of a delay cell 21a is set at a low level at the instant corresponding to the falling edge of the control signal. In FIG. 8B, the third-stage delay cell block 21 detects the same inflection point as described above.

In each delay cell block 21, the F/F circuit 21b is operated by the falling edge of a control signal to detect whether an output signal of the delay cell 21a is set at a low level or not. If, as shown in FIG. 8A, the F/F circuit 21b in the second-stage delay cell block 21 detects that the output signal a2 of the delay cell 21a in the same block 21 is set at a low level, the low-level switching signal s2 is supplied from the AND circuit 21c in the same block 21 to the terminal S of the delay cell 21a (the output signal is set at a low level). Thus, a delay time of the delay cell 21a in the second-stage delay cell block 21 is fixed to t. Since, moreover, the low-level switching signal s2 is also supplied to the AND circuit 21c in the next-stage (third-stage) delay cell block 21, a low-level switching signal s3 is output from the AND circuit 21c in the same block, and delay time of the delay cell 21a in the same (third-stage delay cell) block 21 is fixed to t. Similarly, low-level switching signals sx (x=4 to n) are supplied in order to the AND circuits 21c in the delay cell blocks 21 in the subsequent stages. As a result, a delay time of the delay cell 21a in each of the delay cell blocks 21 in the fourth stage and its subsequent stages, is fixed to t.

On the other hand, as shown in FIG. 8B, when the F/F circuit 21b in the third-stage delay cell block 21 detects that an output signal a3 of the delay cell 21a in the same block 21 is set at a low level, a low-level switching signal s3 is output from the AND circuit 21c in the same block 21 to the terminal S of the delay cell 21a (the output signal is set at a low level). Thus, delay time of the delay cell 21a in the third-stage delay cell block 21 is fixed to t. Since, moreover, the low-level switching signal s3 is also supplied to the AND circuit 21c in the next-stage (fourth-stage) delay cell block 21, a low-level switching signal s4 is output from the AND circuit 21c in the same block 21, and delay time of the delay cell 21a in the same (fourth-stage delay cell) block 21 is fixed to t. Similarly, low-level switching signals sx (x=5 to n) are supplied in order to the AND circuits 21c in the delay cell blocks 21 in the subsequent stages. As a result, a delay time of the delay cell 21a in each of the delay cell blocks 21 in the fifth stage and its subsequent stages, is fixed to t.

Even though the number of delay cells 21a in the delay circuits 11' and 13' is set in such a manner that a delay time between input and output signals of the delay circuits 11', and 13' exceeds 1.5T, the pulse width of an output signal of the final delay cell 21a of each of the delay circuits 11' and 13', becomes ½ of that (T) of the input signal (reference signals Fin1 and Fin2). Thus, a frequency range of the reference signals can be broadened further in order to obtain a multiple output.

Contrary to the case of FIG. 6, if the delay time is set to 2t when the control signal is at a low level and it is set to t when the control signal is at a high level, the F/F circuit detects that an output signal of a delay cell is set at a high level at the instant corresponding to the rising edge of the control signal. Then, as in FIG. 7, a switching signal has only to be supplied from the AND circuit to the terminal S of the delay cell.

In the first and second embodiments described above, the delay cell (see FIG. 3) is so constituted that a delay time is switched by changing the driving force of inverter circuits. The present invention is not limited to this. For example, the delay cell can be so constituted that a delay time is switched by changing a connection of inverter circuits.

Figure 9:
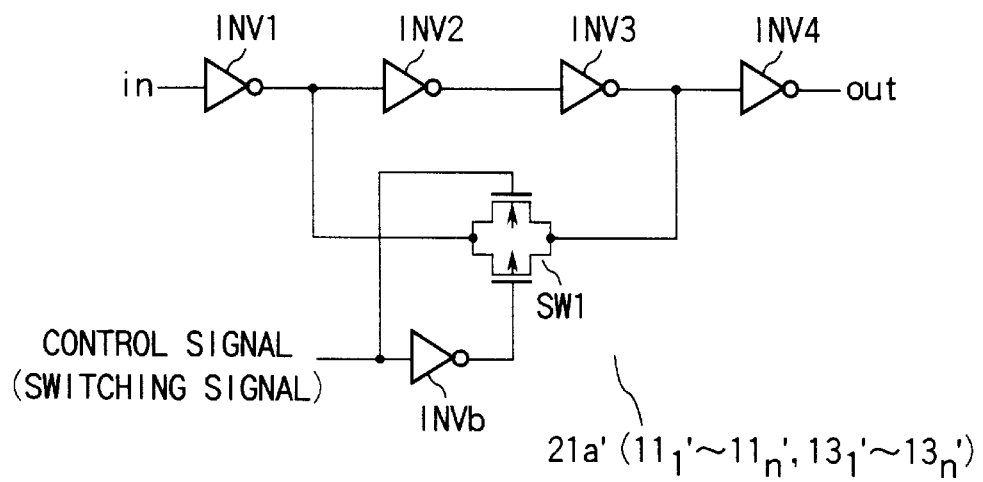
FIG. 9 is a schematic view showing another example of the delay cell.

FIG. 9 shows another example of the delay cells used in the frequency multipliers 10 and 10' according to the first and second embodiments. In this example, a delay cell 21a' ($11_1'$ to $11_n'$, $13_1'$ to $13_n'$) includes four inverters INV1 to INV4 connected in series, and a delay time of each of the inverters is 0.5t. An analog switch SW1 is connected between a node of an output terminal of the inverter circuit INV1 and an input terminal of the inverter circuit INV2 and a node of an output terminal of the inverter circuit INV3 and an input terminal of the inverter circuit INV4. The analog switch SW1 is constituted of an nMOS transistor and a pMOS transistor. The nMOS transistor is supplied with a control signal (or a switching signal), and the pMOS transistor is supplied with a control signal through an inverter circuit INVb.

In the circuit arrangement shown in FIG. 9, when the control signal is at a low level, the analog switch SW1 is turned off; therefore, a signal supplied to an input terminal in is transmitted to the inverter circuits INV1 to INV4 and then output from an output terminal out with a delay of time 2t. On the other hand, when the control signal is at a high level, the analog switch SW1 is turned on to cause a short circuit between the output terminal of the inverter circuit INV1 and the input terminal of the inverter circuit INV4. Thus, a signal supplied to the input terminal in is delayed by time t and output from the output terminal out.

In the above arrangement, too, a delay time of the delay cell 21a', can be switched at a fixed rate. The rate of the delay time can be determined by adjusting a delay time for each of the inverter circuits INV1 to INV4 and the number of inverter circuits.

(Third Embodiment) In the foregoing first and second embodiments, the duty of reference signal Fin1 is 50%. The present invention is not limited to this. For example, a frequency multiplier can be constituted irrespective of the duty of a reference signal.

Figure 10:
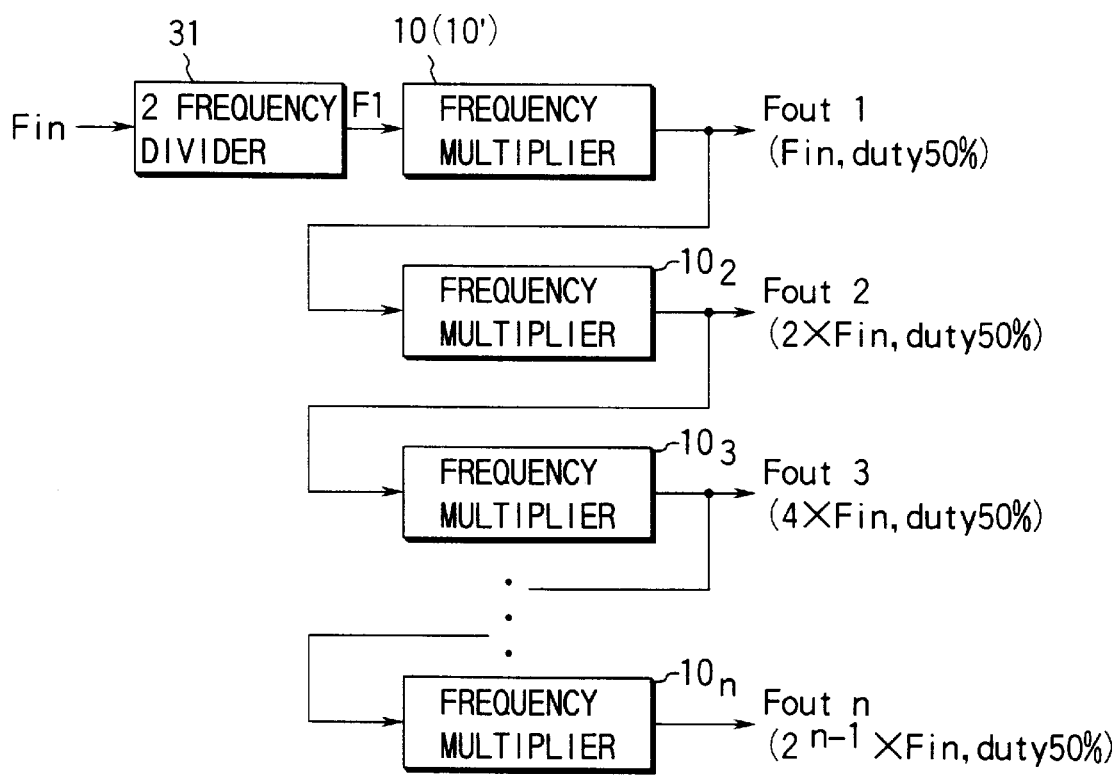
FIG. 10 a schematic view showing an arrangement of frequency multipliers according to a third embodiment of the present invention.

FIG. 10 schematically shows an arrangement of frequency multipliers according to a third embodiment of the present invention. A 2 frequency divider 31 is provided in the stage precedent to a frequency multiplier 10(10') to generate a signal F1 (corresponding to the reference signal Fin1) from the reference signal Fin1. The frequency of the signal F1 is half of that of the reference signal Fin, and the duty thereof is 50%. If the signal F1 so generated is used as an input signal of the frequency multiplier 10, a multiple output (Fout1) whose frequency is the same as that of the reference signal Fin and whose duty is 50%, is obtained from the frequency multiplier 10.

If, as shown in FIG. 10, a multiple output (Fout1) of the frequency multiplier 10 is supplied to the next-stage frequency multiplier $10_2$ as an input signal thereof, a multiple output (Fout2) whose frequency is twice as high as that of the reference signal Fin and whose duty is 50%, is obtained from the frequency multiplier $10_2$.

Similarly, a plurality of frequency multipliers (n frequency multipliers in this embodiment) are connected in cascade and they are so arranged that a multiple output of one frequency multiplier is supplied to the next frequency multiplier as an input signal thereof, a multiple output (Foutn) whose frequency is $2^{(n-1)}$ times as high as that of the reference signal Fin and whose duty is 50%, can finally be obtained from the final-stage frequency multiplier $10_n$.

As detailed above, the frequency multiplier of the present invention generates a multiple signal simply by propagating a reference signal through a delay circuit, without any capacitors and resistors for low-pass filters or without feedback control. The frequency multiplier is therefore capable of generating an unregulated, stable multiple output without feedback control and decreasing in size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A frequency multiplier comprising:
   a first delay circuit including a plurality of delay cells connected in cascade, each of the delay cells varying a delay amount between input and output signals in response to a first control signal, and a first one of the delay cells being supplied with a reference signal;
   a second delay circuit including a plurality of delay cells connected in cascade, each of the delay cells varying a delay amount between input and output signals in response to a second control signal, and a first one of the delay cells being supplied with an inverted signal of the reference signal; and
   an adder circuit for adding an output signal of the first delay circuit and an output signal of the second delay circuit together to generate a multiple signal of the reference signal.

2. The frequency multiplier according to claim 1, wherein the delay cells each include a plurality of inverter circuits, and the delay amount is varied by changing a driving force of the inverter circuits in accordance with a level of corresponding one of the first and second control signals.

3. The frequency multiplier according to claim 1, wherein the delay cells each include a plurality of inverter circuits, and the delay amount is varied by changing a connection of the inverter circuits in accordance with a level of corresponding one of the first and second control signals.

4. The frequency multiplier according to claim 1, wherein two delay times between the input and output signals of the delay cells are switched to each other substantially at a fixed rate in accordance with a level of corresponding one of the first and second control signals.

5. The frequency multiplier according to claim 1, wherein the number of delay cells of each of the first and second delay circuits is so determined that an output signal having a pulse width, which is ½ of a half cycle time of the reference signal, is generated as an output of each of the first and second delay circuits.

6. The frequency multiplier according to claim 5, wherein the number of delay cells of each of the first and second delay circuits is so determined as to satisfy T<T0<1.5T when the half cycle time of the reference signal is T and a delay time between input and output signals in each of the first and second delay circuits is T0.

7. The frequency multiplier according to claim 1, wherein the reference signal is used as the first control signal.

8. The frequency multiplier according to claim 1, wherein the inverted signal of the reference signal is used as the second control signal.

9. The frequency multiplier according to claim 1, wherein the reference signal has a duty of 50%.

10. The frequency multiplier according to claim 9, wherein the reference signal is generated using a 2 frequency divider.

11. A frequency multiplier comprising:
   a first delay circuit having a plurality of delay circuit sections connected in cascade, a first one of the delay circuit sections being supplied with a reference signal, each of the delay circuit sections including:
      a delay cell in which a delay amount between input and output signals is varied substantially at a fixed rate in response to a first switching signal;
      a first level detection circuit having a first input terminal supplied with a first control signal and a second input terminal supplied with an output signal of the delay cell, for detecting a level of the output signal of the delay cell at a timing corresponding to one of rising and falling edges of the first control signal; and
      a switching circuit for generating the first switching signal based on a detection result of the first level detection circuit and the first control signal, and supplying the first switching signal to the delay cell;
   a second delay circuit having a plurality of delay circuit sections connected in cascade, a first one of the delay circuit sections being supplied with an inverted signal of the reference signal, each of the delay circuit sections including:
      a delay cell in which a delay amount between input and output signals is varied substantially at a fixed rate in response to a second switching signal;
      a second level detection circuit having a first input terminal supplied with a second control signal and a second input terminal supplied with an output signal of the delay cell, for detecting a level of the output signal of the delay cell at a timing corresponding to one of rising and falling edges of the second control signal; and
      a switching circuit for generating the second switching signal based on a detection result of the second level detection circuit and the second control signal, and supplying the second switching signal to the delay cell; and
   an adder circuit for adding an output signal of the first delay circuit and an output signal of the second delay circuit together to generate a multiple signal of the reference signal.

12. The frequency multiplier according to claim 11, wherein a switching circuit of one of the delay circuit sections supplies a switching signal to another switching circuit of a subsequent delay circuit section.

13. The frequency multiplier according to claim 11, wherein the delay cell includes a plurality of inverter circuits, and the delay amount is varied by changing a driving force of the inverter circuits in response to corresponding one of the first and second switching signals.

14. The frequency multiplier according to claim 11, wherein the delay cell includes a plurality of inverter circuits, and the delay amount is varied by changing a connection of the inverter circuits in response to corresponding one of the first and second switching signals.

15. The frequency multiplier according to claim 11, wherein two delay times between the input and output signals of the delay cell are switched to each other in response to corresponding one of the first and second switching signals.

16. The frequency multiplier according to claim 11, wherein two propagation velocities of the input and output signals of the delay cell are switched to each other in response to corresponding one of the first and second switching signals.

17. The frequency multiplier according to claim 11, wherein the reference signal is used as the first control signal.

18. The frequency multiplier according to claim 11, wherein the inverted signal of the reference signal is used as the second control signal.

19. The frequency multiplier according to claim 11, wherein the reference signal has a duty of 50%.

20. The frequency multiplier according to claim 19, wherein the reference signal is generated using a 2 frequency divider.

* * * * *